United States Patent [19]

Muller

[11] Patent Number: 4,578,774

[45] Date of Patent: Mar. 25, 1986

[54] SYSTEM FOR LIMITING ACCESS TO NON-VOLATILE MEMORY IN ELECTRONIC POSTAGE METERS

[75] Inventor: Arno Muller, Westport, Conn.

[73] Assignee: Pitney Bowes Inc., Stamford, Conn.

[21] Appl. No.: 514,726

[22] Filed: Jul. 18, 1983

[51] Int. Cl.[4] .................. G06F 12/14; G06F 13/12
[52] U.S. Cl. ........................................ 364/900; 371/62; 365/195; 364/466; 340/799; 340/814
[58] Field of Search ... 364/200 MS File, 900 MS File, 364/187, 464, 466; 371/14, 62, 66; 365/195, 227, 228; 340/799, 814

[56] References Cited

U.S. PATENT DOCUMENTS

| | | | |
|---|---|---|---|
| 4,050,096 | 9/1977 | Bennett et al. | 364/200 |
| 4,139,786 | 2/1979 | Raymond, Jr. et al. | 307/238 |
| 4,145,761 | 3/1979 | Gunter et al. | 365/227 |
| 4,149,241 | 4/1979 | Patterson | 364/200 |
| 4,241,418 | 12/1980 | Stanley | 364/900 |
| 4,271,487 | 6/1981 | Craycraft et al. | 365/189 |
| 4,279,020 | 7/1981 | Christian et al. | 364/900 |
| 4,307,445 | 12/1981 | Juhacz et al. | 371/66 X |
| 4,337,524 | 6/1982 | Parkinson | 371/66 |
| 4,375,663 | 3/1983 | Arcara et al. | 364/200 |
| 4,399,538 | 8/1983 | Cholakian et al. | 371/66 |
| 4,412,284 | 10/1983 | Kerforne et al. | 371/66 X |
| 4,433,390 | 2/1984 | Carp et al. | 364/900 |
| 4,445,198 | 4/1984 | Eckert | 364/900 |
| 4,458,307 | 7/1984 | McAnlis et al. | 365/228 X |
| 4,458,308 | 7/1984 | Holtey et al. | 364/200 |
| 4,475,180 | 10/1984 | Sekiya et al. | 365/228 |
| 4,481,590 | 11/1984 | Otten | 364/464 X |

Primary Examiner—James D. Thomas
Assistant Examiner—Thomas Lee
Attorney, Agent, or Firm—David E. Pitchenik; Albert W. Scribner; William D. Soltow, Jr.

[57] ABSTRACT

A method and associated apparatus for limiting the erasing and writing of data in the non-volatile memory (NVM) of an electronic postage meter operated under microcomputer control to predetermined periods of time after the power up and during the power down cycles of the meter, comprising the steps and associated apparatus for providing an output power signal in response to the establishment of a power up voltage condition, generating an output pulse in response to the presence of the output power signal, presetting the width of the output pulse to provide sufficient time to erase the desired data words from the NVM, applying a bias enable signal to an NVM enable terminal during the duration of the output pulse, enabling the remaining terminals of the NVM during the duration of the output pulse to allow the erasure of data from the NVM, removing the output power signal in response to a power down voltage condition, interrupting the operation of the microcomputer in response to the removal of the output power signal to ready the microcomputer for writing data in NVM, applying the bias enable signal to the NVM enable terminal at the inception of the power down cycle, enabling the remaining terminals of the NVM to allow the writing of data into the NVM during power down for a predetermined time period, and biasing the terminals of the NVM during normal postage meter operation to preclude writing of data into and erasure of data from the NVM.

21 Claims, 1 Drawing Figure

SYSTEM FOR LIMITING ACCESS TO NON-VOLATILE MEMORY IN ELECTRONIC POSTAGE METERS

BACKGROUND OF THE INVENTION

The present invention relates to electronic postage meters, and more particularly to a memory protection circuit for the non-volatile memory (NVM) of an electronic postage meter.

Various electronic postage meter systems have been developed, as for example the systems disclosed in U.S. Pat. No. 3,978,457 for Microcomputerized Electronic Postage Meter Systems, in U.S. Pat. No. 3,938,095 for Computer Responsive Postage Meter and in European Patent Application, Application No. 80400603.9, filed May 5, 1980 for Electronic Postage Meter Having Improved Security and Fault Tolerance Features. Electronic postage meters have also been developed employing plural computing systems; such a system is shown in U.S. Pat. No. 4,301,507, for Electronic Postage Meter Having Plural Computing Systems and assigned to Pitney Bowes, Inc. of Stamford, Conn.

Electronic postage meters include non-volatile memory capability to store critical postage accounting information. This information includes, for example, the amount of postage remaining in the meter for subsequent printing or the total amount of postage already printed by the meter. Other types of accounting or operating data may also be stored in the non-volatile memory, as desired.

The non-volatile memory in electronic postage meters provides a storage function accomplished in prior mechanical type postage meters by mechanical accounting registers. However, postage meters with mechanical accounting registers are not subject to the many problems encountered by electronic postage meters. Conditions do not normally occur in mechanical type postage meters that prevent accounting for a printing cycle or which result in the loss of data stored in the mechanical accounting registers. Moreover, in mechanical postage meters it is not necessary to electronically monitor the position of the mechanical components associated with the printing of postage. This, however, is not the case with electronic postage meters.

Conditions can occur in electronic postage meters where information stored in non-volatile memory may be permanently lost. Conditions such as a total line power failure or fluctuation in voltage conditions can cause the microprocessor associated with the meter to operate erratically and either cause erasure of data or the writing of spurious data in the nonvolatile memory. The erasure of data or the writing of spurious data in the non-volatile memory may result in a loss of information representing the postage funds stored in the meter. Since data of this type changes with the printing of postage and is not permanently stored elsewhere, there is no way to recapture or reconstruct the lost information. Under such circumstances, it is possible that a user may suffer a loss of postage funds.

To minimize the likelihood of a loss of information stored in the non-volatile memory, efforts have been expended to insure the high reliability of electronic postage meters. Some systems for protecting the critical information stored in the meter are disclosed in the above-noted patents and applications. An additional arrangement to protect the postage meter accounting information is disclosed in U.S. Pat. No. 4,285,050 for Electronic Postage Meter Operating Voltage Variation Sensing System, assigned to the same assignee as the present invention.

In view of the foregoing, it is desirable to provide a power supply for electronic postage meters which is physically associated with and part of the meter. In the event of an external power failure, the power supply within the secure housing of the postage meter continues to generate a sufficient, regulated power, for a long enough time to orderly and accurately transfer critical information from the volatile memory (RAM) to the non-volatile memory. The problem of insuring proper power during a power down cycle is compounded because certain non-volatile memories need several different voltages for proper operation. As an example, one type of solid state memory requires the presence of three different voltages to accomplish a write or erase operation.

While the microprocessors used in electronic postage meters can be reset and become inoperative below a predetermined voltage level, such microprocessors may become active again at even lower voltage levels. The microprocessors may be turned off below a predetermined voltage level and threafter within a lower range turn on again and be capable of outputting data. The microprocessors will again turn off below the lower predetermined range. Because of this unreliable operation with respect to reset or turn off, the accounting information within the postage meter can be destroyed by the inadvertent erasing of data or writing of spurious data during a power down cycle when the microprocessor is believed to be inoperative. Moreover, the cost of carefully testing and selecting microprocessor component for postage meters to avoid this problem can greatly increase the cost of such parts, both because of the cost of testing and because of the rejection of the microprocessor devices that exhibit this characteristic.

Systems have been designed to preserved information stored in electronic memory units when power fails. Examples of systems of this type are shown in U.S. Pat. No. 3,859,638 for a Non-Volatile Memory Unit with Automatic Standby Power, Supply; U.S. Pat. No. 4,049,951 for Data Detection Apparatus; and U.S. Pat. No. 3,676,717 for Non-Volatile Flip-Flop Memory Cell. These systems, in part, involve sensing power failure and taking measures to insure data is not lost such as by employing an auxiliary standby power supply or by loading the data into a non-volatile memory. Other U.S. patents which show systems to protect stored information are U.S. Pat. No. 3,801,963 for Method and Apparatus for Transferring Data from a Volatile Data Store Upon the Occurrence of a Power Failure in a Computer; U.S. Pat. No. 3,959,778 for Apparatus for Transferring Data from a Volatile Main Memory to a Store Unit Upon the Occurrence of an Electrical Supply Failure in a Data Processing System; U.S. Pat. No. 3,810,116 for Volatile Memory Protection; and U.S. Pat. No. 3,980,935 for Volatile Memory Support System.

Another postage meter power failure protection system is shown and described in U.S. Pat. No. 3,978,457 for Microcomputerized Electronic Postage Meter System. In this system, when a voltage drops below a threshold level, a signal is generated which initiates a shut down routine. As part of the shut down routine, the contents of a working random access memory are transferred to a non-volatile memory. The maximum time to detect the shut down signal and the time to transfer the register contents from the work memory to the non-volatile memory is a function of the circuit components including the power supply filter capacitors. It is known that during "power-up" and "power-down" the microprocessor may not function predictably and, therefore, that the memory must be protected. The protection is accomplished by gates.

U.S. Pat. No. 4,445,198, issued on April 24, 1984, in the name of Alton B. Eckert, entitled, MEMORY PROTECTION CIRCUIT FOR AN ELECTRONIC POSTAGE METER, provides a memory protection circuit which protects against unreliable microprocessor operation when power failure occurs for any reason. The memory protection circuit maintains the integrity of the accounting data stored in the meter by insuring that information is not inadvertently written into or erased from the non-volatile memory during a power down cycle. Further, such patent application in the name of Alton B. Eckert describes the various voltage levels necessary for writing into different types of non-volatile memories and the requirement to maintain such voltages for a long enough time during the power down cycle to provide an orderly and accurate transfer of critical information from the volatile memory (RAM) to the NVM. However, in accordance with such patent application although the NVM is protected during the power down cycle from the writing of spurious data therein, there is no such protection afforded to the NVM during normal meter operation when a fluctuation in voltage conditions may cause the microprocessor to operate erratically, causing the erasure of data or the writing of spurious data in the non-volatile memory.

In accordance with such patent application of Alton B. Eckert bias voltages are maintained on the non-volatile memory for sufficient time during the power down cycle to provide an orderly and accurate transfer of critical information from the RAM to the NVM if the power supplied has reached its expected output voltage. However, should a power failure occur during power up shortly after the write terminal of the NVM is energized, it is possible that critical information may be lost since the write terminal voltage is removed at the same point on the power supply output voltage curve during the power down cycle as it is applied to the write terminal during power up.

In U.S. Pat. No. 4,285,050 an operating voltage variation sensing system is disclosed for an electronic postage meter using hysteresis for the power down and power up cycles. Although such circuit provides control of the application of an enable voltage to the non-volatile memory during power up and power down of the meter, it is relatively complex and expensive to implement. Further, such circuit utilizes the architecture of the microprocessor to provide the power down cycle threshold voltage.

A problem arises in that great care must be taken to ensure that there is no alteration of the stored information, particularly no erasure of the entire block of the information, as might occur in the event of the malfunction of a circuit coupled to the memory. While all such circuits, including the microprocessor and the address-generation circuit as well as the memory itself are carefully constructed so as to minimize any chance of failure which might affect the storage of information, nevertheless, it is the nature of electronic circuitry that there is always some chance, albeit a very small chance, that a malfunction could occur and that such malfunction might endanger the storage of the data in the memory.

One particular vehicle by which stored data may be lost arises in the nature of the control circuit for the memory. Typically, such memories are produced commercially as preformed packages with a predesignated arrangment of pins for electrical connection, which pins may be plugged into a socket. In particular, in order to ensure versatile operation of the non-volatile memory, a common address scheme and a common control scheme are provided for all the memories. The control scheme provides for a pair of control lines carrying a two-bit signal for designating four possible functions, namely, read, write, block-erase, and word erase. The selection of the particular function is provided by the control generation circuit in combination with the microcomputer.

The foregoing problem in the maintenance of the security of the stored information is, therefore, directly connected with the generation of the control signals for designating the foregoing four memory functions. In particular, it is noted that while the read and write functions are continually used during the operation of the accounting board, and that while the word-erase funtion would be utilized whenever it is desired to update stored data, the block-erase function would never be used to erase the memory in view of its storage of a history file on the use of the postage meter.

It is apparent therefore, that in the event of a malfunction in the microcomputer or in the control generation circuit, which malfunction would inadvertently provide the two-bit control signal designating the block-erase function, then the non-volatile memory would become erased in its entirety. Accordingly, a substantial increase in the security of the operation of the accounting board, particularly with respect to the storage of data in the non-volatile memory, is obtained if a security device is provided which prevents the presentation of the unauthorized block-erase signal at the memory. One such system is disclosed in pending patent application Ser. No. 397,395, filed on July 12, 1982, in the name of T. Germaine et al., entitled, SECURITY SYSTEM FOR USE WITH ELECTRONIC POSTAGE METER TO PREVENT BLOCK ERASURE OF DATA, which discloses circuits for preventing the block erase of data from non-volatile memory during meter operation.

Pending patent application Ser. No. 485,778 filed on April 18, 1983, in the name of Arno Muller for NON-VOLATILE MEMORY PROTECTION CIRCUIT FOR AN ELECTRONIC POSTAGE METER utilizes a microprocessor output operating under software or firmware control to prevent inadvertent erasing of data from or writing data in NVM during normal postage meter operation.

Pending patent application Ser. No. 489,971 filed on April 29, 1983, in the name of Alton B. Eckert et al. for NON-VOLATILE MEMORY PROTECTION CIRCUIT WITH MICROPROCESSOR INTERACTION provides a system for controlling non-volatile memory during the power up, power down and normal operating cycles of an electronic postage meter which among other things applies a bias voltage to the non-volatile memory for erasing or writing data therein only in the presence of an output control signal from the microporocessor operating under software or firmware control.

In summary, prior systems and techniques generally utilize the microprocessor to monitor the power signal condition with software activating or deactivating the NVM in response to a predetermined power condition. That is, the microprocessor generally controls the NVM at all times except when the power is below nominal voltage. This raises the possibility during normal meter operation that the software or firmware may cause the inadvertent erasure of or the writing of data in NVM.

SUMMARY OF THE INVENTION

It is an object of the present invention to provide a hardware interlock which precludes inadvertent erasure or writing of data in the NVM by the meter software during normal meter operation.

It is a further object of the present invention to provide a system for limiting microcomputer access to the NVM of an electronic postage meter for erasing and writing of data therein to predetermined periods during power up and power down.

It is a further object of the present invention to provide a system which minimizes the effect of operating program malfunctions on the NVM.

It is a further object of the present invention to provide a system in which the probability and magnitude of any damage to the data in the NVM is greatly reduced.

Briefly, in accordance with the present invention, a system is provided for limiting the erasing and writing of data in the non-volatile memory (NVM) of an electronic postage meter operated under microcomputer control to predetermined periods of time after the power up and during the power down cycles of the meter, comprising the steps and associated apparatus for providing an output power signal in response to the establishment of a power up voltage condition, generating an output pulse in response to the presence of the output power signal, presetting the width of the output pulse to provide sufficient time to erase the desired data words from the NVM, applying a bias enable signal to an NVM enable terminal during the duration of the output pulse, enabling the remaining terminals of the NVM during the duration of the output pulse to allow the erasure of data from the NVM, removing the output power signal in response to a power down voltage condition, interrupting the operating of the microcomputer in response to the removal of the output power signal to ready the microcomputer for writing data in NVM, applying the bias enable signal to the NVM enable terminal at the inception of the power down cycle, enabling the remaining terminals of the NVM to allow the writing of data into the NVM during power down for a predetermined time period, and biasing the terminals of the NVM during normal postage meter operation to preclude the writing of data into and erasure of data from the NVM.

Other objects, aspects and advantages of the present invention will be apparent from the detailed description considered in conjunction with the drawings.

DETAILED DESCRIPTION

Figure 1:
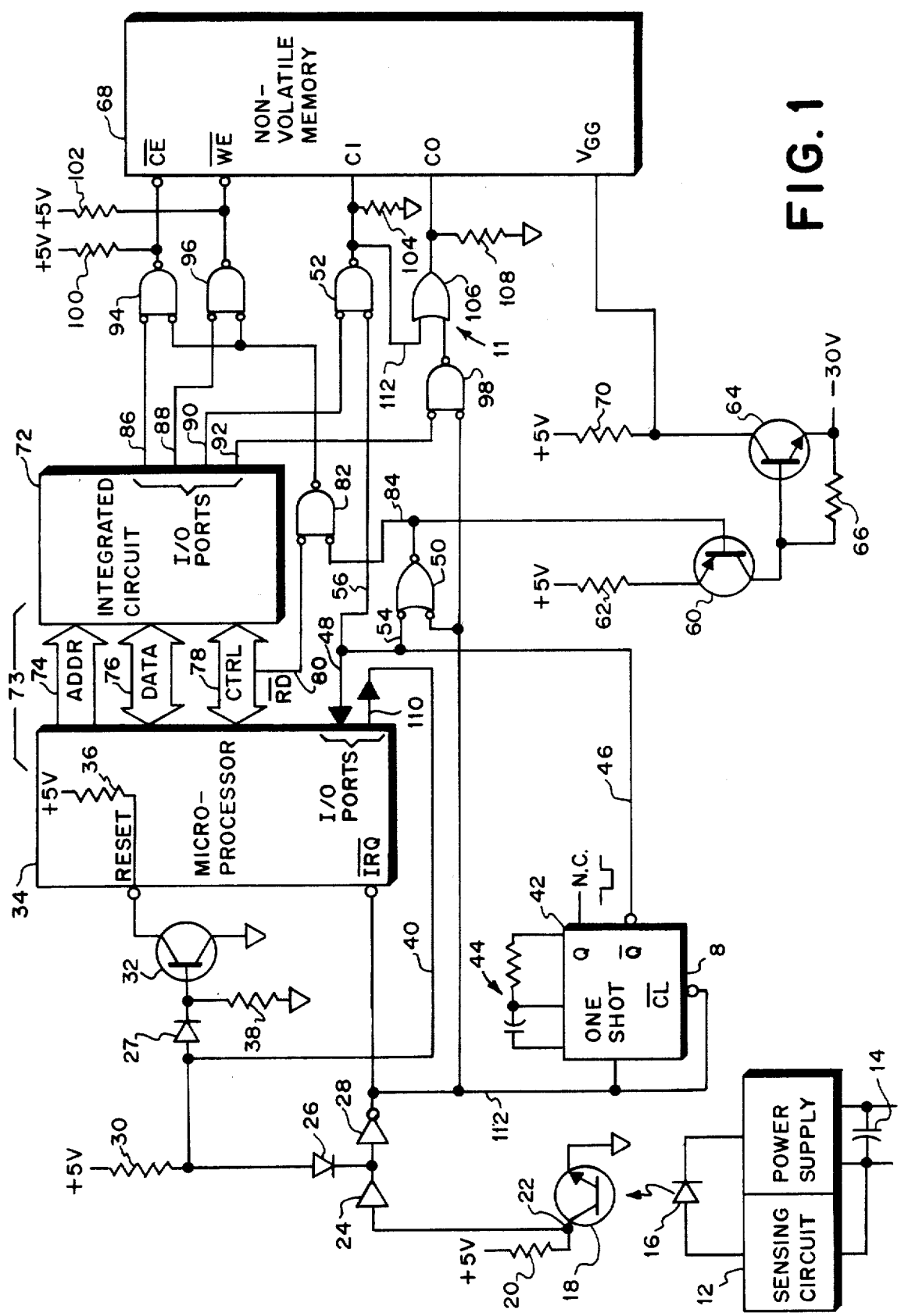
FIG. 1 illustrates a circuit for implementing the system for limiting access to the NVM of an electronic postage meter in accordance with the present invention.

Referring to FIG. 1, a circuit for implementing the present invention is generally illustrated at 10. A conventional voltage sensing circuit designated as 12, which may be a voltage sensing circuit of the type disclosed in copending application Ser. No. 306, 979, filed on September 29, 1981, in the name of Alton B. Eckert, entitled, MEMORY PROTECTION CIRCUIT FOR AN ELECTRONIC POSTAGE METER, provides an output signal during power up of the electronic postage meter when a capacitor 14 is fully charged.

A LED 16 receives current from the voltage sensing circuit 12 once the capacitor 14 is fully charged. The LED 16 is optically connected to a phototransistor 18 whose collector terminal 22 is normally held high by a +5V bias electrically coupled thereto through a current limiting resistor 20. However, when the LED 16 is activated by current flow, the phototransistor 18 conducts providing a low output at the collector terminal 22. The signal present at the collector terminal 22 is amplified by amplifier 24. The output of amplifier 24 is coupled to the cathode of a diode 26 and to the input terminal of an inverter 28. The anode of the diode 26 is electrically coupled to a +5V bias through a current limiting resistor 30. The anode of the diode 26 is coupled to the anode of another diode 27 which compensates for the voltage drop across diode 26. The cathode of diode 27 is coupled to the base of an NPN transistor 32 whose emitter terminal is grounded and whose collector terminal is electrically connected to a $\overline{\text{RESET}}$ terminal of a microprocessor 34; the $\overline{\text{RESET}}$ terminal is normally pulled high through the application of +5V bias through a current limiting resistor 36. The microprocessor 34 may be a Model No. 8039 microprocessor available from Intel Corporation. The base of the transistor 32 is normally pulled toward ground through a current limiting resistor 38. An output port 110 of the microprocessor 34 is coupled to the anode of the diode 27 through line 40.

The output of the inverter 28 is electrically connected to an $\overline{\text{IRQ}}$ terminal (Interrupt Request) of the microprocessor 34 so that the $\overline{\text{IRQ}}$ terminal is held low prior to receiving a high output from the inverter 28 after power up. The output of the inverter 28 is also coupled to the input terminal and $\overline{\text{CL}}$ terminal (clear) of an edge triggered oneshot multivibrator 42, such as Model 74121 available from Texas Instruments. An RC circuit 44 is coupled to the multivibrator 42 to establish a time constant which determines the pulse width of the output pulse of the multivibrator 42. The output terminal Q of the multivibrator 42 is not connected. The output $\overline{\text{Q}}$ of the multivibrator 42 provides a feedback signal to the microprocessor 34 on line 46 at input port 48 and also supplies one of the inputs to AND gate 50 and NOR gate 52 over lines 54 and 56, respectively, which are interconnected to line 46.

The other input to AND gate 50 is obtained directly from the output of the inverter 28 over line 58. The output of the AND gate 50 is coupled to the base of a PNP transistor 60 which has a +5V bias coupled to the emitter terminal through a current limiting resistor 62. The collector terminal of the transistor 60 is coupled to the base terminal of an NPN transistor 64. The collector terminal of the transistor 64 is coupled to a −30V bias. A feedback resistor 66 couples the emitter terminal of the transistor 64 to the base terminal so that the transistor 64 is normally held cut-off. During cut-off, the terminal $V_{GG}$ of the non-volatile memory (NVM) 68 is pulled toward +5V by the +5V bias and current limiting resistor 70 coupled to the collector terminal of the transistor 64. The non-volatile memory 68 may be a Model 3400 NVM available from GENERAL INSTRUMENT CORPORATION.

The microprocessor 34 is coupled to an integrated circuit chip 72, such as Model No. 8755 available from Intel Corporation, which includes a PROM for storing the firmware for the meter and I/O ports for receiving and transmitting signals; the microprocessor 34 and integrated circuit chip 72 forming a microcomputer 73. Interactive communication between the microprocessor 34 and the integrated circuit 72 is maintained over address, data and control lines 74, 76 and 78, respectively. Such an electronic postage meter arrangement, which includes echoplex communication, is disclosed in copending patent applications Ser. No. 447,815, filed on December 8, 1982, in the names of Danilo Baun and Alton B. Eckert, entitled STAND-ALONE ELECTRONIC MAILING MACHINE, Ser. No. 447, 919, filed on December 8, 1982, in the names of John H. Soderberg et al., entitled, POSTAGE METER WITH KEYBOARD KEYS FOR CAUSING DISPLAY OF DATA PERTAINING TO METER OPERATION, and Ser. No. 447,861, filed on December 8, 1982, in the names of John H. Soderberg et al., entitled POSTAGE METER WITH KEYBOARD KEYS FOR CAUSING METER OPERATIONS TO BE PERFORMED. Ser. No. 447,919, filed on December 8, 1982, in the names of John H. Soderberg et al., entitled, POSTAGE METER WITH KEYBOARD KEYS FOR CAUSING DISPLAY OF DATA PERTAINING TO METER OPERATION, and Ser. No. 447,861, filed on December 8, 1982, in the names of John H. Soderberg et al., entitled POSTAGE METER WITH KEYBOARD KEYS FOR CAUSING METER OPERATIONS TO BE PERFORMED.

The control lines 76 between the microprocessor 34 and integrated circuit 72 include a line 80 for normally supplying a $\overline{RD}$ (Read) signal to an OR gate 82. The other input to the OR gate 82 is supplied from the output of the AND gate 50 on line 84.

Output ports 86, 88, 90 and 92 of the integrated circuit 72 provide signals under control of the microprocessor 34 to gates 94, 96, 52, and 98, respectively. Specifically, port 86 provides one input to OR gate 94 which receives its other input from the output of OR gate 82. The output of OR gate 94 is coupled to the chip enable terminal ($\overline{CE}$) of the NVM 68. The output of the OR gate 94 and therefore the $\overline{CE}$ terminal is normally pulled high by a +5V bias applied thereto through pull up resistor 100.

The other input to the OR gate 96 is supplied from the output of OR gate 82. The output of OR gate 96 is coupled to the write enable terminal ($\overline{WE}$ of the NVM 68. The output of the OR gate 96 and therefore the $\overline{WE0}$ terminal is normally pulled high by a +5V bias applied thereto through pull up resistor 102.

The output of the NOR gate 52 is coupled to the $C_1$ terminal of the NVM 68. The $C_1$ terminal is normally pulled low toward ground through pull down resistor 104. Additionally, the output of the NOR gate 52 is applied to the input of an OR gate 106. The other input to OR gate 106 is supplied from the output of NOR gate 98 which also receives an input from line 58. The output of OR gate 106 is coupled to the $C_0$ terminal of the NVM 68. The $C_0$ terminal is normally pulled low toward ground through pull down resistor 108.

In order to write or erase data from the NVM 68, both the $\overline{CE}$ terminal and $\overline{WE}$ terminal must be enabled by low signals present at these terminals. Additionally, for writing terminal $C_0$ must be high (1) and $C_1$ low (0). For word or byte erasure, terminal $C_0$ must be high (1) and $C_1$ high (1). Block erasure of all the data in the NVM 68 only occurs with $C_0$ low (0) and $C_1$ high (1); this condition is precluded by the arrangement of gates 52 and 106. In contrast in order to read data from the NVM 68, it is only necessary that the $\overline{CE}$ terminal be enabled by the presence of a low signal, and that terminal $C_0$ be held low (0) and terminal $C_1$ be held low (0).

In operation, after power up, when the capacitor 14 is fully charged, current flows through the LED 16 biasing the phototransistor 18 into conduction. The resulting current flow shorts the collector terminal to ground providing a low signal to the input of the amplifier 24. The amplified low signal appears at the cathode of the diode 26 causing the same to conduct current. The current flowing through resistor 30, diode 27 and the base of transistor 32 is cut off, thus turning off transistor 32 and removing the $\overline{RESET}$ signal from the microprocessor 34.

The low signal present at the input of the inverter 28 results in a high signal at its output terminal and at the interrupt request ($\overline{IRQ}$) terminal of the microprocessor 34. The microprocessor 34 now begins to operate. A high signal present at the $\overline{IRQ}$ terminal advises the microprocessor 34 that the power up condition has been attained. The microprocessor 34 than provides an output signal from output port 110 over line 40 to the anode of diode 27 holding the diode 27 in a reversed biased condition so that transistor 32 is held cut-off and the $\overline{RESET}$ terminal remains inactive (high) being pulled high by the +5V bias and pull-up resistor 36.

The high signal present at the output of the inverter 28 is applied to the input terminal of the one-shot multivibrator 42 over line 112. This high signal results in an output pulse (low) at the output terminal $\overline{Q}$ of the multivibrator 42. The time constant of the RC circuit 44 determines the pulse width and establishes the necessary time for erasing data words or bytes during the power down cycle which will be explained in more detail below.

The low output pulse from the one-shot multivibrator 42 is applied over various lines to gates allowing access to the NVM 3400. Specifically, the low output pulse is applied over line 46 as a feedback signal to input port 48 of the microprocessor 34. This causes the microprocessor 34 to interact with the software of the integrated circuit 72 over address, data and control lines 74, 76 and 78, respectively, to provide low signals at output terminals 86, 88, 90 and 92, as required. Specifically, terminals 86 and 88, supply a low to one of each of the two inputs to OR gates 94 and 96. Additionally, low signals are provided from terminals 90 and 92 to NOR gates 52 and 98, respectively. Further, a $\overline{RD}$ (Read) pulse is supplied from the microprocessor 34 to the OR gate 82.

The low output pulse is also applied to one input each of AND gate 50 and NOR gate 52. The other input to AND gate 50 is a high input supplied from the output of inverter 28 on line 58. In the presence of the low input pulse from the one-shot multivibrator 42, the AND gate 50 provides a low output to the base of the PNP transistor 60 causing the same to conduct. When transistor 60 conducts, NPN transistor 64 is also biased into conduction and the $-30V$ bias is applied to the terminal $V_{GG}$ of NVM 68 enabling the NVM 68 for reading, writing and erasing of data in accordance with the signals present at the terminal $\overline{CE}$, $\overline{WE}$, $C_1$ and $C_0$.

The low signal present at the output of the AND gate 50 is supplied to the OR gate 82 which in the presence of a $\overline{RD}$ pulse from the microprocessor 34 applies a low output pulse to the respective inputs of OR gates 94 and 96. When a low output signal is supplied on line 86 from the integrated circuit 72, the output of the OR gate 94 is pulled low enabling the $\overline{CE}$ terminal of the NVM 68. When terminal CE is enabled, data can be read from the NVM 68 since terminals $C_1$ and $C_0$ are normally held low. Thus, the microprocessor 34 can read the data present in the NVM 68 and store the same in RAM (not shown).

Thereafter, under microprocessor control low output signals are supplied through lines 86, 88 and 90 to the gates 94, 96 and 52 resulting in a high signal (1) at the output of the NOR gate 52 and at the terminal $C_1$. The presence of a high signal at the output of the NOR gate 52 results in a high signal at the output of the OR gate 106 and at the terminal $C_0$. The low signals present at outputs 86 and 88 are supplied to AND gates 94 and 96, respectively, which in the presence of a $\overline{RD}$ pulse from the microprocessor 34 apply low pulses to the $\overline{CE}$ and $\overline{WE}$ terminals of the NVM 68. When terminals $\overline{CE}$ and $\overline{WE}$ are enabled and terminals $C_0$ and $C_1$ are in the high state, the word addressed by the microcomputer 34 in the NVM 68 is erased. Thus, words of data are erased from the NVM 68 in the presence of the pulse from the multivibrator 42. The pulse is of sufficient duration to enable the microprocessor 34 to erase as many words as required from the NVM 68. That is, the width of the output pulse from the multivibrator 42 is adjusted to allow for access to the maximum number of words to be stored.

After the predetermined time period set by the RC circuit 44, the output pulse of the multivibrator 42 goes high causing the output of the AND gate 50 to go high which turns off transistors 60 and 64 and removes the $-30V$ enable voltage from terminal $V_{GG}$ precluding the erasure of further data or the writing of data in the NVM 68. When AND gate 50 goes high, the output of OR gate 82 also goes high as does the output of OR gates 94 and 96, deactivating the $\overline{CE}$ and $\overline{WE}$ terminals of the NVM 68. Therefore, data can no longer be written into or erased from NVM 68. Further, the output of the NOR gate 52 is held low in the presence of the high input on lines 46 and 56 and therefore $C_1$ is held low (0) by pull down resistor 104. Likewise, the high input to NOR gate 98 on line 58 results in a low input to OR gate 106. The other input received from the output of NOR gate 52 on line 112 is also low. Therefore, the output of OR gate 106 is low and $C_0$ is held low by pull down resistor 108. Thus, the microprocessor 34 can only read data from the NVM 34 during normal meter operation.

As soon as the power is interrupted, i.e., upon commencement of the power down cycle, current ceases to flow in the LED 16 since the capacitor 14 begins to discharge. This in turn cuts off phototransistor 18. Thus, the input supplied to the amplifier 24 is high and the output is high. The output of the inverter 28 goes low and supplies a low signal to the $\overline{IRQ}$ terminal advising the microprocessor 34 that a power down cycle is commencing. During this time the microprocessor 34 continues to provide an output signal which reverse biases diode 27 holding transistor 32 cut off and the $\overline{RESET}$ terminal is held high preventing reset. However, in the presence of a low signal at the $\overline{IRQ}$ terminal the microprocessor 34 immediately ceases all activities and begins to transfer (write) data, which is normally stored in RAM, in NVM 68 when terminals $\overline{CE}$, $\overline{WE}$, $C_1$, $C_0$ and $V_{GG}$ are enabled. These terminals are enabled as follows. The low from the output of the inverter 28 is applied to the $\overline{CL}$ terminal of the multivibrator 42 to inhibit the generation of a pulse at the output terminal $\overline{Q}$. The low output from the inverter 28 is also applied via line 58 to the input of AND gate 50 resulting in a low at the output of AND gate 50. The low signal at the output of AND gate 50 causes the application of $-30$ volts to the terminal $V_{GG}$ in the manner previously described. The microprocessor 34 under program control supplies low output signals from terminals 86 and 88 to the inputs of OR gates 94 and 96, respectively. In the presence of a low signal on line 84 from AND gate 50 and a $\overline{RD}$ pulse from the microprocessor 34, the output of the OR gate 82 is pulsed low and therefore the outputs of the OR gates 94 and 96 are pulsed low, enabling terminals $\overline{CE}$ and $\overline{WE}$.

A low signal on line 58 in the presence of a low signal from output terminal 92 will produce a high at the output of NOR gate 98 and therefore a high at terminal $C_0$ for writing in NVM 68. $C_1$ remains low due to pull down resistor 104 since a low output is present at the output terminal of NOR gate 52 due to the presence of high signals on lines 90 and 56.

After the writing of data in NVM 68 is completed, the microprocessor 34 generates a high signal at output port 110 and the anode of diode 27 is biased high. This causes diode 27 to conduct, turning transistor 32 on and shorting the collector terminal to ground. Thus, the $\overline{RESET}$ terminal is held low. This causes the microprocessor 34 to provide high signals at all of the output ports 86, 88, 90 and 92 and on lines 80 and 40. This in turn disables the OR gates 94 and 96 so that the terminals $\overline{CE}$ and $\overline{WE}$ are held high precluding any further access to the NVM 68 by the microprocessor 34.

Thus, in accordance with the foregoing description it is apparent that the present invention provides hardware control of the NVM to allow specific windows of time after power up and at the inception of power down to enable the NVM for erasure and writing of data, respectively, while precluding the erasure and writing of data during normal meter operation. Therefore, it is less likely that NVM data will be affected by spurious signals and erroneous microprocessor activity.

It is known and should be understood for the purpose of the present application that the term postage meter refers to the general class of devices for the imprinting of a defined unit value for governmental or private carrier delivery of parcels, envelopes, or other like application, for unit value printing. Thus, although the term postage meter is utilized, it is both known and employed in the trade as a general term for devices utilized in conjunction with services other than those exclusively employed by governmental postage and tax services. For example, private, parcel and freight services purchase and employ such meters as a means to provide unit value printing and accounting for individual parcels.

It should be apparent to those skilled in the art that various modifications may be made in the present invention without departing from the spirit and scope thereof as described in the specification and defined in the appended claims.

What is claimed is:

1. A method for limiting an erasing of data from and a writing of data into a non-volatile memory (NVM) of an electronic postage meter operated under control of a microcomputer to predetermined periods of time after a power up cycle and during a power down cycle of the meter the NVM having data therein after the power up cycle and during the power down cycle, the NVM having a enable terminal and a plurality of remaining terminals, comprising the steps of:

providing an an output power signal in response to an establishment of a power up voltage condition;

generating an output pulse in response to the output power signal;

presetting the output pulse to a width that will provide sufficient time to erase desired data from the NVM;

applying a bias enable signal to the NVM enable terminal during the width of the output pulse;

enabling the remaining terminals of the NVM during the width of the output pulse to allow for the erasing of the desired data from the NVM;

removing the output power signal in response to a power down voltage condition;

interrupting the microcomputer control of the electronic postage meter in response to the removal of the output power signal to ready the microcomputer for writing desired data into the NVM;

applying the bias enable signal to the NVM enable terminal at a begining portion of the power down cycle for a predetermined time period;

enabling the plurality of remaining terminals of the NVM to allow the writing of the desired data into the NVM during power down for said predetermined time period; and biasing the plurality of remaining terminals of the NVM during normal postage meter operation to preclude writing of data into and erasing of data from the NVM.

2. The method recited in claim 1, wherein:
the NVM terminals are enabled after power up to establish a NVM word erase condition for a period of time coincident with the duration of the output pulse.

3. The method recited in claim 1, wherein:
the NVM terminals are enabled during power down to establish a NVM write condition for a period of time as determined by the microcomputer to enable all the desired data to be written into NVM.

4. The method recited in claim 1, including the step of:
transmitting a first interrupt signal to the microcomputer in the presence of the output power signal to advise the microcomputer that the power up cycle is completed.

5. The method recited in claim 1, including the step of:
transmitting a second interrupt signal to the microcomputer to advise the microcomputer that the power down cycle has commenced.

6. The method recited in claim 1, including the step of:
transmitting the output pulse to the microcomputer to activate the microcomputer for erasing the desired data in the NVM.

7. The method recited in claim 1, including the step of:
providing a feedback signal which prevents resetting of the microcomputer after completion of the power up cycle, during normal operation and during the beginning portion of the power down cycle until all the desired data has been written into NVM.

8. The method recited in claim 1, including the step of:

gating the output signals from the microcomputer to preclude the erasure of data from the NVM in the absence of the output pulse.

9. The method recited in claim 1, including the step of:
gating the output signals from the microcomputer to preclude writing of data in the NVM after ap predetermined period of time as determined by the microcomputer.

10. The method recited in claim 1, including the step of:
resetting the microcomputer after all the desired data has been written into the NVM.

11. A method for limiting an erasing of data from and a writing of data into a non-volatile memory (NVM) of an electronic postage meter operated under control of a microcomputer to predetermined periods of time after a power up cycle and during a power down cycle of the meter the NVM having data therein after the power up cycle and during the power down cycle, the NVM having an enable terminal and a plurality of remaining terminals, comprising the steps of:

providing an output power signal in response to an establishment of a power up voltage condition;

generating an output pulse in response to the output power signal;

presetting the output pulse to a width that will provide sufficient time to erase desired data from the NVM;

applying a bias enable signal to the NVM enable terminal during the width of the output pulse;

enabling the remaining terminals of the NVM during the width of the output pulse to allow the erasing of the desired data from the NVM;

removing the output power signal in response to a power down voltage condition;

interrupting microcomputer control of the electronic postage meter in response to the removal of the output power signal to ready the microcomputer for writing desired data in NVM;

applying the bias enable signal to the NVM enable terminal at a beginning of the power down cycle for a predetermined time period;

enabling the remaining terminals of the NVM to allow the writing of the desired data into the NVM during power down for said predetermined time period;

biasing the remaining terminals of the NVM during normal postage meter operation to preclude the writing of data into and erasure of data from the NVM;

the NVM terminals are enabled after power up to establish an NVM word erase condition for a period of time coincident with the duration of the output pulse;

the NVM terminals are enabled during power down to establish an NVM write condition for a period of time as determined by the microcomputer to enable all the desired data to be written into NVM;

transmitting a first interrupt signal to the microcomputer in the presence of the output power signal to advise the microcomputer that the power up cycle is completed;

transmitting a second interrupt signal to the microcomputer to advise the microcomputer that the power down cycle has commenced;

transmitting the output pulse to the microcomputer to activate the microcomputer for erasing the desired data in the NVM;

providing a feedback signal which prevents resetting of the microcomputer after completion of the power up cycle, during normal operation and during the beginning portion of the power cycle until all the desired data has been written into NVM;

gating the output signals from the microcomputer to preclude erasure of data from the NVM in the absence of the output pulse; and gating the output signals from the microcomputer to preclude writing of data in the NVM after a predetermined period of time as determined by the microcomputer.

12. A system for limiting an erasing of data from and a writing of data into a non-volatile memory (NVM) of an electronic postage meter to predetermined periods of time after a power up cycle and during a power down cycle of the meter the NVM having data therein after the power up cycle and during the power down cycle, the NVM having an enable terminal and a plurality of terminals, comprising:

signal means for providing an output signal in response to a power up voltage condition;

pulse supplying means electrically connected to said signal means for providing an output pulse having a predetermined width in accordance with presence of an output signal from said signal means;

a microcomputer means electrically connected to said pulse supplying means and said signal means for receiving signals therefrom;

gate means interposed between said microcomputer means and the non-voltaile memory for enabling the non-volatile memory upon power up of the electronic postage meter when the output pulse is provided from said pulse supplying means to allow desired data to be erased from the non-volatile memory by said microcomputer and for enabling the non-volatile memory during power down of the electronic postage meter when the output signal is removed from said signal means to allow desired data to be written into the non-volatile memory for a predetermined period of time accordance with output signal provided from said microcomputer.

13. The system recited in claim 12, wherein:
said signal means includes an LED and a phototransistor responding thereto.

14. The system recited in claim 12, wherein:
said pulse supplying means includes a one-shot multivibrator and RC circuit electrically coupled thereto to establish the pulse width of the output pulse.

15. The system recited in claim 12, including:
transistor switching means responding to the output pulse for applying a bias voltage to the NVM for enabling the erasure of the desired data therefrom during the duration of the output pulse.

16. The system recited in claim 15, including:
additional gate means interposed between said pulse supplying means and said gate means for activating said gate means in response to the output pulse.

17. The system recited in claim 12. including:
circuit means for preventing a reset signal from being applied to said microcomputer upon receipt of the power up output signal by said micrcomputer.

18. The system recited in claim 12, including:
bias means for biasing the remaining terminals of the NVM during normal postage meter operation to preclude writing and erasing of data therein.

19. The system recited in claim 12, including:
interrupt means electrically coupled to said signal means and said microcomputer for supplying an interrupt signal to said microcomputer in response to the power up output signal being provided from said signal means.

20. The system recited in claim 12, including:
signal inverting means coupled to said signal means for supplying a signal to activate said additional gate means in the absence of the power up output signal from said signal means indicating a beginning of the power down cyle.

21. A system for limiting access to a non-volatile memory (NVM) of an electronic postage meter for an erasing and a writing data therein to predetermined periods of time after a power up cycle and during a power down cycle of the meter the NVM having data therein after the power up cycle and during the power down cycle, the NVM having an enable terminal and a plurality of remaining terminals, comprising:

signal means for providing an output signal in response to a power up voltage condition;

pulse supplying means electrically connected to said signal means for providing an output pulse having a predetermined width in accordance with presence of an output signal from said signal means, said pusle supplying means including a one-shot multivibrator and circuit means electrically coupled to thereto establish the pulse width of the output pulse;

a microcomputer means electrically connected to said pulse supplying means and said signal means for receiving signals therefrom;

gate means interposed between said microcomputer means and the non-volatile memory for enabling the non-volatile memory upon power up of the electronic postage meter when the output pulse is provided from said pulse supplying means to allow desired data to be erased from the non-volatile memory by said microcomputer and for enabling the non-volatile memory during power down of the electronic postage meter when an output signal is removed from said signal means to allow desired data to be written into the non-volatile memory for a predetermined period of time in accordance with the output signal being provided from said microcomputer;

switching means responding to the output pulse for applying a bias voltage to the NVM for enabling the erasing of the desired data therefrom during the width of the output pulse;

additional gate means interposed between said pulse supplying means and said gate means for activating said gate means in response to the output pulse;

means for biasing the remaining terminals of the NVM during the normal postage meter operation to preclude the writing and erasing of data therein;

interrupt means electrically coupled to said signal means and said micrmputer for supplying an interrupt signal to said microcomputer in response to the power up output signal being removed from said signal means; and means coupled to said signal means for supplying a signal to activate said additional gate means when the power up output signal is removed from said signal means indicating a beginning of the power down cycle.

* * * * *